(12) United States Patent
Lee

(10) Patent No.: US 7,283,363 B2
(45) Date of Patent: Oct. 16, 2007

(54) COMPUTER CASING

(75) Inventor: Cheng-Ping Lee, Jhonghe (TW)

(73) Assignee: Stirring Enetrprise Co., Ltd., Taipei County (TW)

( * ) Notice: Subject to any disclaimer, the term of this patent is extended or adjusted under 35 U.S.C. 154(b) by 77 days.

(21) Appl. No.: 11/335,674

(22) Filed: Jan. 20, 2006

(65) Prior Publication Data

US 2007/0171617 A1    Jul. 26, 2007

(51) Int. Cl.
*H05K 7/20* (2006.01)
(52) U.S. Cl. .............. 361/707; 361/712; 361/714; 312/223.2; 174/50; 174/50.54
(58) Field of Classification Search ........ 361/679–686, 361/688, 689, 704–710, 712–714, 726–728, 361/736, 741, 752, 788, 796–800, 802, 803; 174/35 R, 50, 51, 50.51, 50.52, 37, 39; 312/223.21, 312/223.3; 165/80.3, 80.5, 185
See application file for complete search history.

(56) References Cited

U.S. PATENT DOCUMENTS

| | | | | |
|---|---|---|---|---|
| 6,979,772 | B2* | 12/2005 | Meng-Cheng et al. | 174/17 VA |
| 7,095,611 | B2* | 8/2006 | Kunz | 361/687 |
| 7,123,440 | B2* | 10/2006 | Albrecht et al. | 360/97.02 |
| 7,136,286 | B2* | 11/2006 | Chuang | 361/703 |
| 2005/0030719 | A1* | 2/2005 | Lin et al. | 361/719 |

* cited by examiner

*Primary Examiner*—Michael Datskovskiy
(74) *Attorney, Agent, or Firm*—Troxell Law Office, PLLC

(57) ABSTRACT

A computer casing has a frame, two fixing panels arranged inside the frame, and two side panels assembled on opposing sides of the frame. The frame, the fixing panels and the side panels are all made of aluminum. The frame includes a top panel, a bottom panel, a front panel and a rear panel fixed together by means of soldering. The computer casing is secured in entirety and has large dissipation area. Additionally, the computer casing is easily classified and recycled in the case of expiration.

5 Claims, 4 Drawing Sheets

COMPUTER CASING

BACKGROUND OF THE INVENTION (a) Field of the Invention

The present invention relates to a computer casing, and particularly to a computer casing which has firm structure and large dissipation area and which is easy to be recycled when discarded.

(b) Description of the Prior Art

Devices and components associated with computers, for instance, hard disk, main board, and Central Processing Unit (CPU) etc., are developed rapidly with develop of information technology. Processed data involved in multimedia computation are more enormous, and computing speed is promoted quickly, making operating temperature of computation devices and Integrated Circuit (IC) components in the computers become high in excess. Chips on the main board usually give out a great deal of heat during operation. It tends to affect normal performance and even to lower operation speed or shorten lifespan thereof without measures to dissipate heat appropriately. Heat sink and fans are solutions to this problem currently.

A conventional computer casing has a frame with panels on sides thereof. Electronic components and main board are mounted inside the computer casing. CPU is mounted on the main board. Heat sink is also provided on the main board and covers the CPU. A fan is disposed on the heat sink. The heat sink absorbs heat generated by the CPU and expands heat area. The fan blows to dissipate the heat.

However, the frame and panels of the computer casing are detachably assembled together by means of screws. This makes the computer casing weak. Moreover, besides CPU, other components on the main board may generate heat. Space interior the computer casing is closed, so heat therein fails to give out of the computer casing. Heat is recycled inside the computer casing, and correspondingly dissipation effect can not be optimal. Exorbitant high temperature may decrease operation efficiency of CPU and even damage it. On the other hand, a host computer often has metal frame, plastic panels and electronic components, which are respectively made of different material. When the host computer is spoiled and needs to be recycled, the frame, the panels and the components have to be detached and classified, resulting in troublesome recycling process. A computer casing which can solve above problems is desired.

SUMMARY OF THE INVENTION

Accordingly, an object of the present invention is to provide a computer casing having firm structure in entirety.

Another object of the present invention is to provide a computer casing having large dissipation area.

A further object of the present invention is to provide a computer casing apt to be classified and recycled.

The computer casing comprises a frame made of aluminum. The frame includes a top panel, a bottom panel corresponding to the top panel, a front panel and a rear panel respectively provided between front edges and rear edges of the top panel and the bottom panel. The top panel, the bottom panel, the front panel and the rear panel are fixed together by means of soldering. Two fixing panels are both made of aluminum, and are arranged inside and adjacent opposing sides of the frame for accommodating computation devices therebetween. Two side panels are both made of aluminum, and are arranged on opposing sides of the frame. At least one side panel is detachably assembled on the frame.

BRIEF DESCRIPTION OF THE DRAWINGS

FIGS. 2A, 2B and 2C are respectively partially enlarged views of a first dissipation portion, a second dissipation portion, and an edge of a rear panel jointing an edge of a frame.

DETAILED DESCRIPTION OF THE PREFERRED EMBODIMENTS

Figure 1:
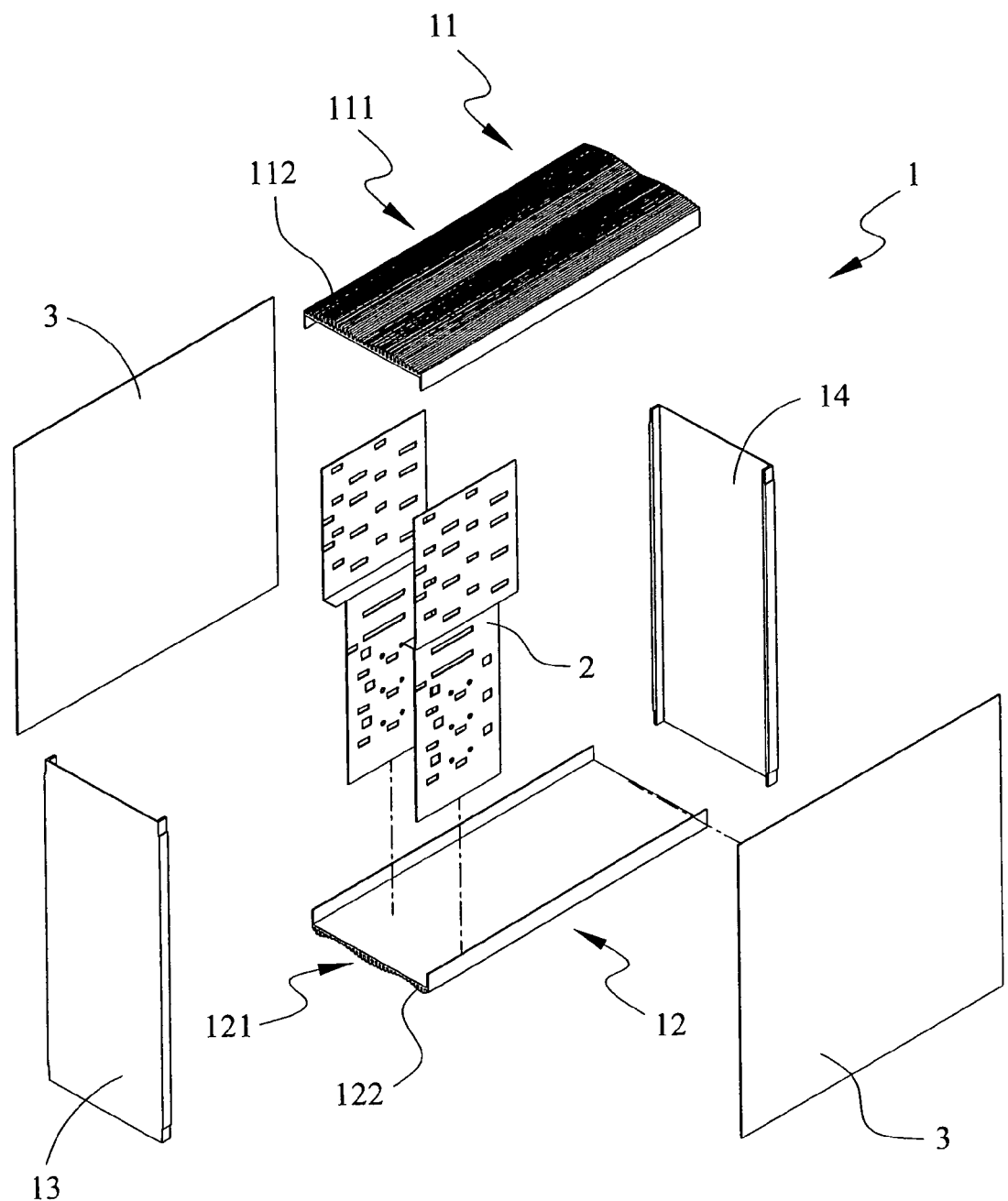
FIG. 1 is an exploded view of a computer casing of the present invention.

With reference to FIG. 1, a computer casing in accordance with the present invention comprises a frame 1, two fixing panels 2 and two side panels 3, which are retentively assembled together.

Figure 2:
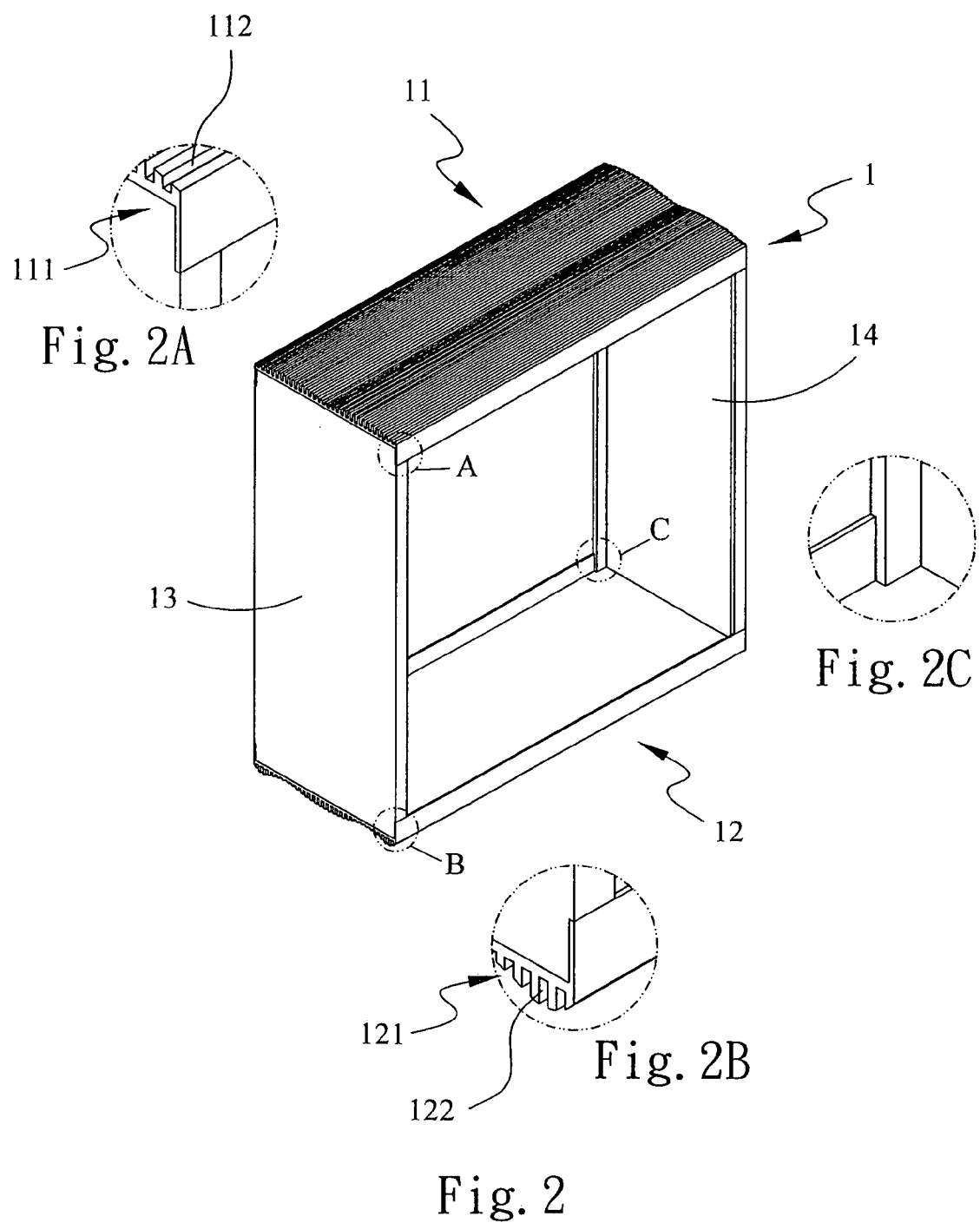
FIG. 2 is a dimensional view of the computer casing.

Referring to FIG. 2, the frame 1 includes a top panel 11, a bottom panel 12 corresponding to the top panel 11, a front panel 13 and a rear panel 14 respectively provided between the top panel 11 and the bottom panel 12. The top panel 11, the bottom panel 12, the front panel 13 and the rear panel 14 are made of aluminum and are fixed together by means of soldering. Further referring to FIGS. 2A and 2B, a first dissipation portion 111 is formed on a surface of the top panel 11, and a second dissipation portion 121 is formed on a surface of the bottom panel 12. The first dissipation portion 111 includes a plurality of first fins 112, and the second dissipation portion 121 includes a plurality of second fins 122. The front panel 13 is securely retained between front edges of the top panel 11 and the bottom panel 12. The rear panel 14 is securely retained between rear edges of the top panel 11 and the bottom panel 12. As an example, FIG. 2C clearly shows an edge of the rear panel 14 jointing an edge of the frame 1.

The two fixing panels 2 are both made of aluminum, and are arranged inside and adjacent opposing sides of the frame 1 for accommodating computation devices therebetween.

The two side panels 3 are both made of aluminum, and are arranged on opposing sides of the frame 1. At least one side panel 3 is detachable relative to the frame 1. In this embodiment, at least one side panel 3 is detachably assembled on the frame 1.

Figure 3:
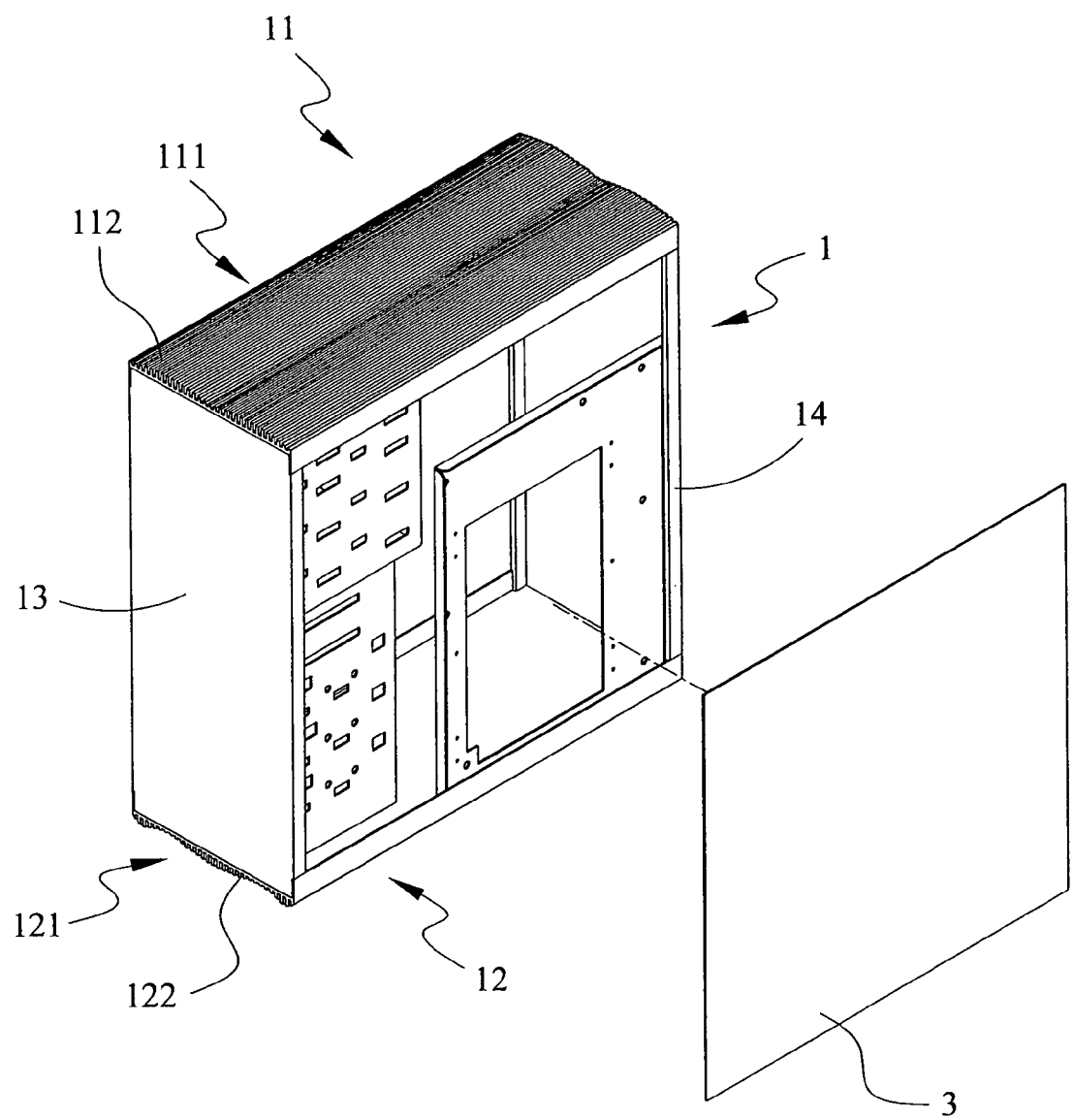
FIG. 3 is an assembled view of the computer casing, wherein a side panel is disassembled from a frame.
Figure 4:
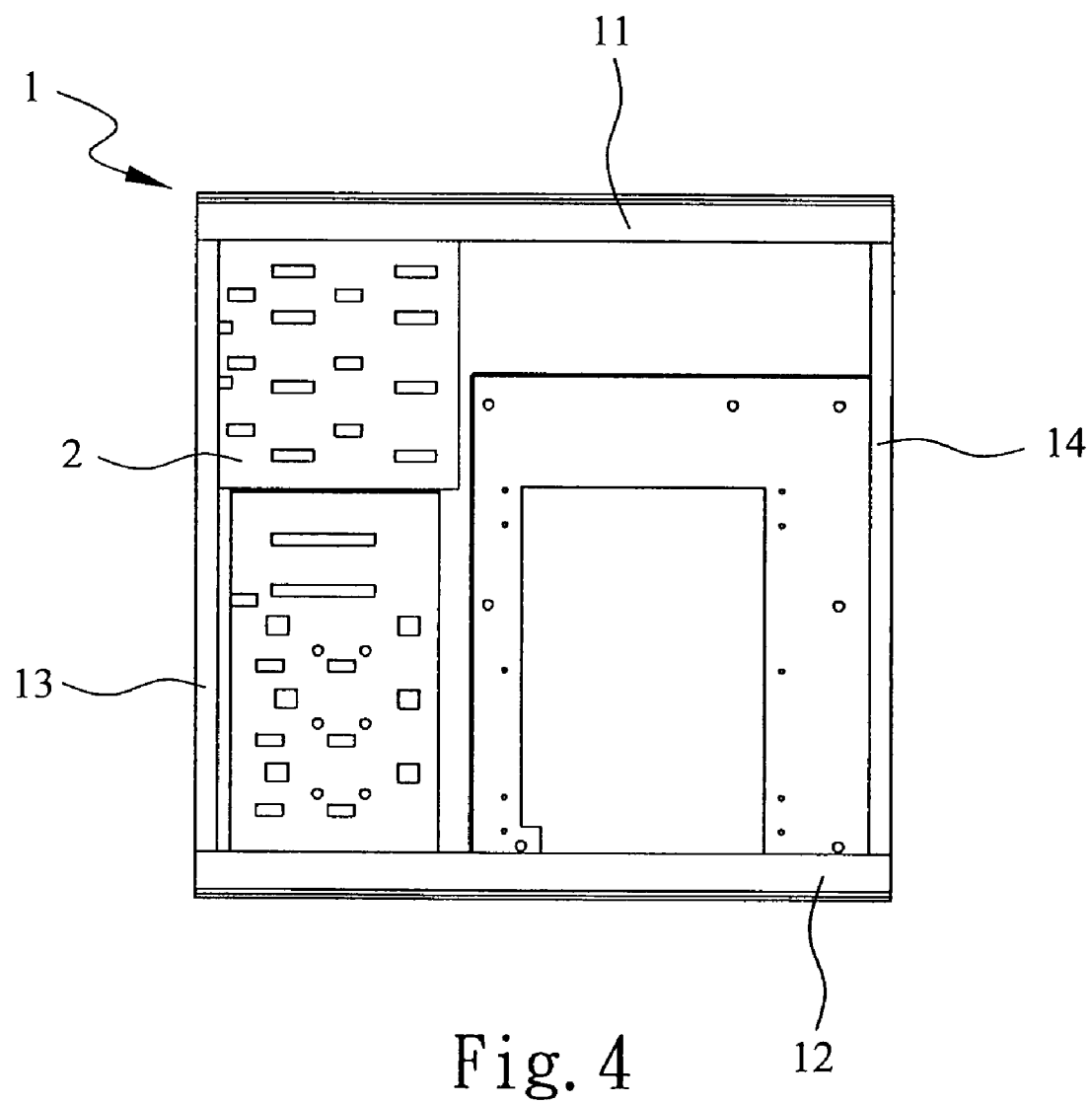
FIG. 4 is a side view of the computer casing, wherein a side panel is removed.

Also referring to FIGS. 3 and 4, in assembly, the top panel 11, the bottom panel 12, the front panel 13 and the rear panel 14 are fixed together by means of soldering, to form the frame 1. Thus the frame 1 is firmly secured in entirety. The fixing panels 2 are mounted inside the frame 1 and adjacent opposing sides of the frame 1 for accommodating devices therebetween. The side panels 3 are mounted on the opposing sides of the frame 1. At least one side panel 3 is detachably mounted on the frame 1 for facilitating repairing. While the computer is working, the frame 1, the fixing panels 2 and the side panels 3 which are all made of aluminum, cooperate with the first dissipation portion 111 and the second dissipation portion 121 to define a large dissipation area, thereby effectively dissipating heat generated in the computer casing. On the other hand, the frame 1, the fixing panels 2 and the side panels 3 which are all made of metal may be classified in one sort when the computer casing needs to be discarded and recycled. Therefore a whole host computer may be generally divided into two sorts, namely, one sort is interior electronic components, and the other sort is metal computer casing, thereby simplifying recycling process.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A computer casing comprising:
 a frame being made of aluminum, and including a top panel, a bottom panel corresponding to the top panel, a front panel and a rear panel respectively provided between the top panel and the bottom panel, the top panel, the bottom panel, the front panel and the rear panel being fixed together by means of soldering;
 two fixing panels being made of aluminum, and being arranged inside and adjacent opposing sides of the frame for accommodating devices therebetween; and
 two side panels being made of aluminum, and being arranged on opposing sides of the frame, at least one side panel being detachable relative to the frame.

2. The computer casing as claimed in claim 1, wherein a first dissipation portion is formed on a surface of the top panel.

3. The computer casing as claimed in claim 2, wherein the first dissipation portion includes a plurality of first fins.

4. The computer casing as claimed in claim 1, wherein a second dissipation portion is formed on a surface of the bottom panel.

5. The computer casing as claimed in claim 4, wherein the second dissipation portion includes a plurality of second fins.

* * * * *